United States Patent
Memetea et al.

(10) Patent No.: US 8,247,163 B2
(45) Date of Patent: Aug. 21, 2012

(54) PREPARING LITHOGRAPHIC PRINTING PLATES WITH ENHANCED CONTRAST

(75) Inventors: Livia T. Memetea, Loveland, CO (US); Jianbing Huang, Trumbull, CT (US); Heidi M. Munnelly, Widsor, CO (US); Scott Wertz, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 561 days.

(21) Appl. No.: 12/483,323

(22) Filed: Jun. 12, 2009

(65) Prior Publication Data

US 2010/0316956 A1  Dec. 16, 2010

(51) Int. Cl.
*G03F 7/00* (2006.01)
*G03F 7/26* (2006.01)

(52) U.S. Cl. ............ 430/302; 430/270.1; 430/309; 430/351; 430/434; 101/450.1; 101/463.1

(58) Field of Classification Search ............ 430/302, 430/434; 101/450.1, 453, 463.1
See application file for complete search history.

(56) References Cited

U.S. PATENT DOCUMENTS

| | | | | |
|---|---|---|---|---|
| 3,660,101 A | * | 5/1972 | Owens et al. | ............ 430/449 |
| 4,175,964 A | * | 11/1979 | Uchida et al. | ............ 430/253 |
| 4,731,317 A | | 3/1988 | Fromson et al. | |
| 5,580,704 A | | 12/1996 | Yoshida et al. | |
| 5,637,435 A | | 6/1997 | Shimizu | |
| 6,451,491 B1 | | 9/2002 | Dhillon et al. | |
| 7,402,374 B2 | | 7/2008 | Oohashi et al. | |
| 7,425,406 B2 | | 9/2008 | Oshima et al. | |
| 7,462,440 B2 | | 12/2008 | Yamasaki | |
| 2008/0274429 A1 | * | 11/2008 | Teng | ............ 430/303 |
| 2011/0177137 A1 | * | 7/2011 | Chauhan et al. | ............ 424/400 |

FOREIGN PATENT DOCUMENTS

| | | |
|---|---|---|
| EP | 1 641 128 | 3/2006 |
| GB | 1 215 437 | 12/1970 |
| JP | 4 051045 A | 2/1992 |
| JP | 11 227353 A | 8/1999 |
| JP | 11-227353 A * | 8/1999 |
| JP | 2008-230122 | 2/2008 |
| WO | WO 99/47976 A1 | 9/1999 |

OTHER PUBLICATIONS

Computer Translation of JP11-227353 A (Dec. 2011).*

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Lithographic printing plates can be prepared with enhanced contrast between the image and background by coloring the imaged or exposed regions using a coloring fluid containing a water-insoluble colorant (dye or pigment) and an organic solvent that swells the imaged regions sufficiently for the colorant to be embedded or diffused therein.

20 Claims, No Drawings

PREPARING LITHOGRAPHIC PRINTING PLATES WITH ENHANCED CONTRAST

FIELD OF THE INVENTION

This invention relates to a method of preparing lithographic printing plates that have enhanced contrast between the image and background.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is eventually transferred to the surface of a material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers that image in response to signals from a digital copy of the image in a computer connected to a platesetter. This "computer-to-plate" technology has generally replaced the former technology where masking films were used to image the elements.

In general, lithographic printing plates contain a colorant (dye or pigment) in the radiation-sensitive composition that has the function of making the image visible in order to be evaluated by optical density measurements before being mounted on press. In other words, such colorants provide contrast between the image and the background. Certain lithographic printing plates cannot contain a colorant for different reasons. For example, the imaged printing plate precursors that are usually developed on-press have a colorless coating because if a colorant is present, it could contaminate the lithographic printing ink and the fountain solution used for development and printing, with the result of altering the printed color shades. However, sometimes it is necessary for such printing plates to be used the same way as those developed off-press. In such instances, the image needs to be seen and evaluated.

Other lithographic printing plates contain materials that are not compatible with contrast-providing colorants. Such printing plates have a faint colored image that is difficult to distinguish from the anodized aluminum substrate background. This low image contrast makes it almost impossible to evaluate these printing plates for image quality, such as image resolution as measured using optical density measurements before mounting the plates onto a press. Such "colorless" plates are also difficult to "register" (align) when mounting them onto a press. Image registration (alignment) is very important in color printing in order to ensure image sharpness (resolution) and correct tinting shades.

U.S. Pat. No. 6,451,491 (Dhillon et al.) describes the high loading of contrast-providing pigments into the imaging layer using specific poly(vinyl acetal) polymers and specific combinations of loading solvent mixtures. Such high amounts of pigments may not be suitable for all lithographic printing plates as they can destabilize imaging chemistry or developers used to remove non-imaged regions in negative-working lithographic printing plate precursors.

Other contrast-providing colorants are obtained from leuco dyes that become colored in the presence of an acid or thermal acid generator, as described for example, in U.S. Pat. No. 7,402,374 (Oohashi et al.), U.S. Pat. No. 7,425,406 (Oshima et al.) and U.S. Pat. No. 7,462,440 (Yamasaki). These imaging materials have some disadvantages: (i) the acid or radical forming mechanism can be triggered prematurely during the drying of the plate leading to un-wanted color, especially in on-press developed printing plates, (ii) many times, the colored form of the dye is a salt that is soluble in water leading to excessive coating loss if the plate is developed in developer, in severe instances the coating and the color being washed off in developer, (iii) some of the colored forms of the dyes, especially the tri-aryl methane ones are light sensitive introducing additional precautions in handling the plates, and (iv) a high percentage of the leuco dye and of the latent acid has to be added to the coating to ensure a good contrast between the image and background. These components adversely affect the shelf-life, the mechanical properties, and the run-length of the photosensitive coating.

There is a need for an improved means for providing contrast between the image and background of lithographic printing plates, especially those prepared from negative-working lithographic printing plate precursors.

SUMMARY OF THE INVENTION

This invention provides a method of preparing a lithographic printing plate comprising, in order:

A) imagewise exposing a negative-working lithographic printing plate precursor comprising a substrate and a radiation-sensitive imageable layer disposed thereon comprising a free radically polymerizable component, a radiation absorbing compound, a free radical initiator composition, and a polymeric binder, to provide an exposed precursor having solid exposed regions and non-exposed regions in the imageable layer wherein the solid exposed regions have an optical density $OD_1$, and B) applying a coloring fluid to the imaged precursor such that the optical density in the solid exposed regions is $OD_2$ that is greater than $OD_1$, the coloring fluid comprising a water-insoluble colorant and a solvent that is capable of swelling the solid exposed regions of the imageable layer.

In some embodiments, on-press development is carried out after step B. In other embodiments, development is carried out off-press, for example with the following step C:

C) prior to, simultaneously with, or subsequently to step B), developing the imaged precursor using a processing solution to remove the non-exposed regions of the imageable layer and to provide a lithographic printing plate.

In the off-press embodiments, the lithographic printing plate may be rinsed with water after development.

We have found that the present invention provides an advantageous way to increase image contrast between the image of a lithographic printing plate and the background, especially for printing plates obtained from negative-working lithographic printing plates. Thus, the image can be distinguished from the background to allow for pre-press evaluation and measurements of percentage area of various features such as the 0.5%-99% screens and the optical density of the solid image (100%).

These advantages are achieved by treating the printing plate with a coloring fluid (solution or dispersion) of a water-insoluble colorant (dye or pigment) containing a solvent capable of swelling the exposed regions of the imageable layers. The colorant is embedded in those regions and the swelling is done in a controlled manner so that problems such as excessive coating weight loss in the exposed regions, image alteration, smudging of the coating or total dissolution of the image are prevented. The coloration of the exposed (image) regions can be accelerated by colorant dissolution or diffusion into the coating or simply by making the color permeate (embed) into the softened coating through applied pressure (for example rubbing or brushing) or temperature.

The contrast enhancing coloring fluid can be formulated to have multiple applications: (1) to be a processing solution (for example a developer) for the non-exposed regions of the imageable layer and to provide a colorant for the exposed regions at the same time, in a one step treatment, (2) to be a coloring solution applied to a non-developed imaged element, followed by developing in a suitable processing solution, or (3) it can be applied after development for the sole purpose of coloring the exposed regions of the imageable layer.

DETAILED DESCRIPTION OF THE INVENTION

Definitions

Unless the context indicates otherwise, when used herein, the terms "imageable element", "lithographic printing plate precursor", and "printing plate precursor" are meant to be references to embodiments useful in the present invention.

In addition, unless the context indicates otherwise, the various components described herein such as "polymeric binder", "initiator", "co-initiator", "free radically polymerizable component", "radiation absorbing compound", "colorant", and similar terms also refer to mixtures of such components. Thus, the use of the articles "a", "an", and "the" is not necessarily meant to refer to only a single component.

Moreover, unless otherwise indicated, percentages refer to percents by dry weight, for example, weight % based on total solids or dry layer composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

The term "colorant" refers to water-insoluble dye or pigment, as well as mixtures of either dyes, pigments, or dyes and pigments.

The term $OD_1$ refers to the optical density of a solid image of the lithographic printing plate precursor as measured using a spectrodensitometer. This value is an average of densitometer readings taken over several solid patches distributed across the printing plate precursor. Each of the solid patches should be large enough for proper densitometer readings according to the operating instructions for the particular instrument being used. Optical density (OD) can be determined using a suitable spectrodensitometer such as an X-Rite 500 (X-Rite, Inc., Grand Rapids, Mich.). This spectrodensitometer is fitted with four filters used to measure the density of four process colors: cyan, magenta, yellow, and black. Typically, one skilled in the art would be able to identify which filter to choose when measuring optical density. For example, one could measure the solid image area with each of the four filters independently and then select the filter that results in the maximum optical density value.

The term $OD_2$ refers to the optical density of the solid exposed and colored regions of the lithographic printing plate precursor. This value is an average taken over colored solid image regions. The spectrodensitometer filter is chosen as described above for the $OD_2$ measurement.

The difference between $OD_1$ and $OD_2$ is more than 0.1 and generally 0.25 or more.

Coloring Fluid

As described in more detail below, the coloring fluid can be applied to the imaged lithographic printing plate precursor before, during, or after processing (development). If it is applied prior to processing, the non-exposed regions of the imageable layer are at least partially retained after this application (step B) in many instances.

The coloring fluid generally includes water-insoluble colorants such as pigments or water-insoluble dyes, solvents, non-solvents, wetting agents, emollients, and surfactants that can swell the organic material in the imaged (exposed) regions to allow dye or pigment diffusion, dissolution, or embedding. De-sensitizers that maintain the water-carrying property of anodized aluminum can also be added. Organic solvents and water-insoluble pigments and dyes having solubility parameters similar to the imageable layer coating are useful but the invention is not so limited. Humectants, emollients, pigment dispersants, and surfactants that increase the softening of the imageable layer coating and encourage colorant diffusion or embedding are also desired. The coloring fluid is generally formulated to ensure the right amount of imaged region softening or swelling that allows for colorant embedding. Excessive softening leads to negative effects such as smearing of the imaged regions on the plate, screen clogging, the embedded colorant being washed off with dissolved layers of the imaged layer, the imageable layer coating losing its adhesion to the substrate and the dot size being altered, either by sharpening (due to excessive dissolution) or growing (due to excessive swelling or smudging). The coloring fluid is generally an aqueous solution.

Water-insoluble dyes and pigments from all classes can be used including oil-soluble dyes and solvent dyes. Useful water-insoluble dye classes include but are not limited to, diazo dyes, phenazine-azine, triphenazine-oxazine, and induline dyes and specific examples include Sudan Black B and nigrosine dyes (Solvent Black 5, Solvent Black 7, Acid Black 2, and carboxyl modified nigrosine).

Useful pigments include but are not limited to azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments, graphite, and carbon blacks.

The coloring fluid includes one or more water-insoluble colorants in an amount of from about 0.5% to about 80%, typically from about 2% to about 30% and more typically from about 2% to about 20%, based on the weight of the coloring fluid. Useful water-insoluble dyes and pigments generally have a particle size of from about 0.001 to about 10 µm, or typically from about 0.001 to about 1 µm, or more typically from about 0.001 to about 0.05 µm.

Examples of useful solvents that are capable of swelling the exposed regions of the imageable layer include but are not limited to, butoxyethanol, γ-butyrolactone, diethanol amine, triethanolamine, benzyl alcohol, phenoxyethanol, ethylene glycol monomethyl ether, propylene glycol monomethyl ether, propylene glycol methyl ether acetate, dipropylene (or ethylene) glycol monomethyl ether, cyclohexanone, cyclohexanol, toluene, kerosene, mineral spirits, dichloroethane, and tetrachloroethane. Benzyl alcohol, phenoxy ethanol, γ-butyrolactone, butoxyethanol, diacetone alcohol, cyclohexanone, cyclohexanol, glycol ether, a petroleum fraction, a glycol ester, an alkyl lactate, toluene, or a combination of any of these, are particularly useful. One or more of these solvents are generally present in the coloring fluid in an amount of from about 0.5 to about 80 weight %, or typically from about 1 to about 20 weight %, based on total coloring fluid weight.

Acids or alkaline compounds that create a certain pH, as well as buffers that maintain the pH can be added. Useful compounds of this type include but are not limited to, sodium hydroxide, potassium hydroxide, sodium silicate, potassium silicate, primary and secondary amines for alkaline pH, organic and inorganic acids or acidic salts for acidic pH. The coloring fluid can have a pH of from about 1 to about 14 and typically from about 4 to about 10 if it is used as a processing solution as well as providing contrast enhancement.

Examples of emollients that can be present in the coloring fluid include but are not limited to, ethylene glycol, diethylene glycol, di- and tri-ethanol amine, fatty acids and salts and esters thereof, propanol, isopropanol, and cyclohexanol, in an amount of from about 0.5 to about 50 weight % based on total coloring fluid weight.

The coloring fluid can also including one or more surfactants including nonionic surfactants, anionic surfactants, cationic surfactants, amphoteric surfactants, and fluorine-containing surfactants. Useful nonionic surfactants include one or more compounds from the following classes of compounds: polyoxyethylene alkyl ethers, polyoxyethylene alkylphenylethers, polyoxyethylene polystyrylphenyl ethers, polyoxyethylene polyoxypropylene alkyl ethers, polyoxyethylene sorbitol fatty acid partial esters, polyethylene glycol fatty acid esters, fatty acid diethanolamides, polyoxyethylene alkylamines, triethanolamine fatty acid esters, trialkylamine oxides, and copolymers of polyethylene glycol and polypropylene glycol. Other useful nonionic surfactants include the β-naphthol ethoxylates such as those commercially available as Lugalvan® BNO 12 and 24 from BASF.

Useful anionic surfactants include but are not limited to, fatty acid salts, abietic acid salts, hydroxyalkanesulfonic acid salts, dialkylsulfosuccinic ester salts, alkylbenzenesulfonic acid salts, alkylnaphthalenesulfonic acid salts, alkylphenoxy polyoxyethylene propylsulfonic acid salts, polyoxyethylene alkylsulfophenyl ether salts, N-alkylsulfosuccinic acid monoamide disodium salts, alkyl or aryl sulfonic acid salts, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, and polyoxyethylene alkyl phenyl ether phosphate ester salts Useful cationic surfactants include but are not limited to alkylamine salts, quaternary ammonium salts, polyoxyethylene alkyl amine salts, and polyethylene polyamine derivatives.

Useful amphoteric surfactants include but are not limited to, carboxybetaines, aminocarboxylic acids, sulfobetaines, aminosulfuric esters, and imidazoline-based surfactants.

Useful fluorine-containing surfactants include but are not limited to, an anionic type, for example, fluoroalkyl carboxylates, fluoroalkyl sulfonates and fluoroalkylphosphates; an amphoteric type, for example, fluoroalkyl betaines; a cationic type, for example, fluoroalkyl trimethyl ammonium salts, and a nonionic type, for example, fluoroalkyl amine oxides, fluoroalkyl ethylene oxide adducts with any number of substituting F atoms in the alkyl group from 1 to total substitution (perfluoro compounds).

One or more surfactants can be present in the coloring fluid in an amount of from about 0.001 to 20%, or typically from 0.2 to 5% by weight, based on the total solids of the coloring fluid.

Examples of pigment dispersants that may be present include but are not limited to, wetting agents or dispersant agents such as polymeric dispersants with or without electrical charge that work by steric hindrance or by electrostatic repulsion mechanism, amine and carboxyl containing polymers, siliconic, and organo/siliconic dispersants with pigment affinic groups.

Aluminum de-sensitizers can also be present in the coloring fluid. These compounds include but are not limited to, gums (for example, gum arabic and carragean gum), dextrines, cellulose derivatives (such as carboxymethyl cellulose) and phosphoric acid. Alcohols and glycols can be present as wetting agents without being limited to these compounds. Post baking "gums" that protect the image from thermal decomposition and the anodized aluminum background from re-deposition, such as Dowfax® 2A-0 and Dowfax® 2A-1 can be present also.

Thus, in many embodiments, the coloring fluid comprises one or more of a glycol, gum, dextrine, cellulose ester, phosphoric acid or ester, phosphonic acid or ester, citric acid, or citrate in amounts that would be readily determined from routine experimentation.

Imageable Layers

The lithographic printing plate precursors used in this invention include a radiation-sensitive composition disposed on a suitable substrate to form an imageable layer. The imageable elements may have any utility wherever there is a need for an applied coating that is polymerizable using suitable radiation, and particularly where it is desired to remove unexposed regions of the coating instead of exposed regions.

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane(meth)acrylates or urethane(meth) acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated(20)trimethylolpropane triacrylate], and Sartomer 602 [ethoxylated (10)bisphenol A diacrylate] that are available from Sartomer Company, Inc.

Also useful are urea urethane(meth)acrylates and urethane (meth)acrylates described in U.S. Pat. No. 6,582,882 (Pappas et al.), U.S. Pat. No. 6,899,994 (noted above), and U.S. Pat. No. 7,153,632 (Saraiya et al.) and WO 2007/077207, all of which are incorporated herein by reference.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (noted above), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.).

In addition to, or in place of the free radically polymerizable components described above, the radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

The free radically polymerizable component is present in the radiation-sensitive composition in an amount sufficient to render the composition insoluble in an aqueous developer after exposure to radiation. This is generally from about 10 to about 70 weight % and typically from about 20 to about 50 weight % based on the dry weight of the radiation-sensitive composition.

The radiation-sensitive composition includes an initiator composition that is capable of generating radicals sufficient to initiate polymerization of the radically polymerizable component upon exposure to the appropriate imaging radiation. The initiator composition may be responsive, for example, to electromagnetic radiation in the infrared spectral regions, corresponding to the broad spectral range of from about 700 nm to about 1400 nm, and typically from about 700 nm to about 1200 nm. Alternatively, the initiator composition may be responsive to exposing radiation in the ultraviolet or violet region of from about 150 to about 475 nm and typically from about 250 to about 450 nm.

In general, suitable initiator compositions for IR-radiation and violet-radiation sensitive compositions comprise initiators that include but are not limited to, amines (such as alkanol amines), thiol compounds, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562, 543 (Ogata et al.), and onium salts (such as ammonium salts, diaryliodonium salts, triarylsulfonium salts, aryldiazonium salts, and N-alkoxypyridinium salts). For "violet"-sensitive compositions, initiators include but not limited to, hexaarylbiimidazoles, oxime esters, or trihalomethyl substituted triazines.

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 300 nm and up to and including 450 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describe useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

The IR-radiation sensitive initiator compositions generally comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), U.S. Pat. No. 6,051,366 (Baumann et al.), and U.S. Pat. No. 7,368,215 (Munnelly et al.). For example, suitable phosphonium salts include positive-charged hypervalent phosphorus atoms with four organic substituents. Suitable sulfonium salts such as triphenylsulfonium salts include a positively-charged hypervalent sulfur atom with three organic substituents. Suitable diazonium salts possess a positive-charged azo group (that is —N=N⁺). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

Useful halonium salts such as iodonium salts include an onium salt having a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Some useful boron components include organic boron salts that include an organic boron anion such as those described in U.S. Pat. No. 6,569,603 (noted above) that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts and particularly iodonium borates are particularly useful as initiator compounds in radiation-sensitive compounds that are designed for "on-press" development (described in more detail below).

Useful IR radiation-sensitive initiator compositions can comprise one or more diaryliodonium borate compounds, each of which is represented by the following Structure (I):

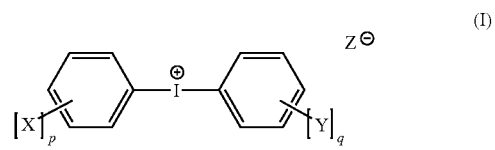

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). For example, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are useful (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions, and or particularly at the 4-position, on either or both phenyl rings.

Despite what type of X and Y groups are present in the iodonium cation, the sum of the carbon atoms in the X and Y substituents is from about 6, and preferably from about 8, to about 40. Thus, in some compounds, one or more X groups can comprise from about 6 carbon atoms, and Y does not exist (q is 0). Alternatively, one or more Y groups can comprise from about 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is from about 6. Still again, there may be a total of from about 6 carbon atoms on both phenyl rings.

In Structure I, p and q are independently 0 or integers of 1 to 5, provided that either p or q is from about 1. For example, both p and q can be 1. Thus, it is understood that the carbon atoms in the phenyl rings that are not substituted by X or Y groups have a hydrogen atom at those ring positions.

$Z^-$ is an organic borate anion represented by the following Structure (II):

(II)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

For example, $R_1$, $R_2$, $R_3$, and $R_4$ are independently substituted or unsubstituted alkyl or aryl groups as defined above, or at least 3 of $R_1$, $R_2$, $R_3$, and $R_4$ are the same or different substituted or unsubstituted aryl groups (such as substituted or unsubstituted phenyl groups). In some embodiments, all of $R_1$, $R_2$, $R_3$, and $R_4$ are the same or different substituted or unsubstituted aryl groups or, all of the groups are the same substituted or unsubstituted phenyl group. For example, $Z^-$ is a tetraphenyl borate wherein the phenyl groups are substituted or unsubstituted.

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Useful compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The initiator composition including one or more initiator compounds is generally present in the radiation-sensitive composition in an amount of from about 0.5% to about 30%, based on the total solids of the radiation-sensitive composition or the dry weight of the coated imageable layer. For example, the initiator composition is present in an amount of from about 2% to about 20 weight %. The optimum amount of the various initiator components may differ for various compounds and the sensitivity of the radiation-sensitive composition that is desired and would be readily apparent to one skilled in the art.

The free radical generating compounds (initiators) may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

IR radiation-sensitive composition sensitivity is provided by the presence of one or more infrared radiation absorbing compounds, chromophores, or sensitizers that absorb imaging radiation, or sensitize the composition to imaging infrared radiation having a $\lambda_{max}$ of from about 700 nm and up to and including 1400 nm, and typically from about 700 to about 1200 nm.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Still other useful infrared radiation absorbing compounds are copolymers that can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The radiation absorbing compounds (or sensitizers) can be present in the radiation sensitive composition (or imageable layer) in an amount generally of at least 0.5% and up to and including 15% and typically at least 1 and up to and including 10%, based on total solids in the composition, that also corresponds to the total dry weight of the imageable layer. The particular amount needed for this purpose would be readily apparent to a skilled worker in the art.

The radiation-sensitive composition includes one or more polymeric binders that are generally present as film-forming continuous polymers or as discrete particles. The following described polymeric binders are particularly useful in the manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly (alkylene oxide)(meth)acrylates.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a primary carbon having three valences filled by hydrogen atoms, a secondary carbon (having two valences filled with hydrogen atoms) or a quaternary carbon (having no hydrogen atoms attached). Typically, most of the non-tertiary carbon atoms are secondary carbon atoms.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

Some useful pendant reactive vinyl groups are alkenyl groups including but not limited to allyl esters, styryl, and (meth)acryloyl groups. For example, such groups can be provided by allyl(meth)acrylates, or by reacting a polymer precursor with an allyl halide, 4-vinylbenzyl chloride, or (meth)acryloyl chloride using conditions that would be apparent to a skilled worker in the art.

V. Polymeric binders can have pendant 1H-tetrazole groups as described in U.S. Ser. No. 11/949,810 (Baumann et al.) that is incorporated herein by reference.

VI. Still other useful polymeric binders may be homogenous, that is, dissolved in the coating solvent, or may exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenyl maleimide are useful.

Other useful polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles.

Other polymeric binders may be used that facilitate on-press development, including but not limited to those that are present as discrete particles having an average particle size of from about 1 to about 500 nm, and typically from about 150 to about 450 nm, and that are generally distributed uniformly within that layer. The particulate polymeric binders exist at room temperature as discrete particles, for example in an aqueous dispersion. However, the particles can also be partially coalesced or deformed, for example at temperatures used for drying coated imageable layer formulations. Even in this environment, the particulate structure is not destroyed. Such polymeric binders generally have a molecular weight ($M_n$) of at least 5,000 to about 100,000.

Useful polymeric binders generally include polymeric emulsions or dispersions of polymers having hydrophobic backbones to which are attached pendant poly(alkylene oxide) side chains, cyano side chains, or both, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.) and U.S. Patent Application Publication 2005/0003285 (Hayashi et al.) that are all incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

The polymeric binders generally have a molecular weight ($M_n$) of at least 2,000 to about 500,000.

The one or more polymeric binders are generally present in the radiation-sensitive composition (and imageable layer) in an amount of at least 5 and up to 70 weight %, and typically from about 10 to about 50 weight % based on the total solids in the composition and layer.

The radiation-sensitive composition (imageable layer) can further comprise one or more phosphate(meth)acrylates monoester, di-ester, or tri-ester, each of which has a molecular weight generally greater than 200 and typically at least 300 and up to and including 1000. By "phosphate(meth)acrylate" we also mean to include "phosphate methacrylates" and other derivatives having substituents on the vinyl group in the acrylate moiety. We also mean to include phosphate(meth)acrylates containing poly(ethylene oxide) or poly(propylene oxide) groups. Such compounds and their use in imageable layers are described in more detail in U.S. Pat. No. 7,175,969 (Ray et al.) that is incorporated herein by reference.

The phosphate(meth)acrylate can be present in the radiation-sensitive composition in an amount of at least 0.5 and up to and including 20% and typically at least 0.9 and up to and including 10%, based on total dry composition weight.

The imageable layer can also include a "primary additive" that is a poly(alkylene glycol) or an ether or ester thereof that has a molecular weight of at least 200 and up to and including 4000. This primary additive is present in an amount of at least 2 and up to and including 50 weight %, based on the total dry weight of the imageable layer. Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30)bisphenol A dimethacrylate), CD9038 (ethoxylated (30)bisphenol A diacrylate), and SR494 (ethoxylated (5)pentaerythritol tetraacrylate), and similar compounds all of which that can be obtained from Sartomer Company, Inc. In some embodiments, the primary additive may be "non-reactive" meaning that it does not contain polymerizable vinyl groups.

The imageable layer can also include a "secondary additive" that is a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). Specific examples of phenolic compounds include but are not limited to, 2,4-dihydroxybenzophenone, 4,4'-isopropylidene-diphenol (Bisphenol A), p-t-butylphenol, 2,4,-dinitrophenol, 3,4-dichlorophenol, 4,4'-methylene-bis(2,6'-di-t-butylphenol), p-phenylphenol, 1,1-bis(4-hydroxyphenyl)cyclohexane, 1,1-bis(4-hydroxyphenyl)-2-ethylhexene, 2,2-bis(4-hydroxyphenyl)butane, 2,2'-methylenebis(4-t-butylphenol), 2,2'-methylenebis(α-phenyl-p-cresol) thiodiphenol, 4,4'-thiobis(6-t-butyl-m-cresol) sulfonyldiphenol, p-butylphenol-formalin condensate, and p-phenylphenol-formalin condensate. Examples of useful organic acids or salts thereof include but are not limited to, phthalic acid, phthalic anhydride, maleic acid, benzoic acid, gallic acid, o-toluic acid, p-toluic acid, salicylic, 3-t-butyl-salicylic, 3,5-di-3-t-butylsalicylic acid, 5-α-methylbenzyl-salicylic acid, 3,5-bis(α-methylbenzyl)salicylic acid, 3-t-octylsalicylic acid, and their zinc, lead, aluminum, magnesium, and nickel salts. Examples of the oxybenzoic acid esters include but are not limited to, ethyl p-oxybenzoate, butyl p-oxybenzoate, heptyl p-oxybenzoate, and benzyl p-oxybenzoate. Such color developers may be present in an amount of from about 0.5 to about 5 weight %, based on total imageable layer dry weight.

The imageable layer can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly (vinyl pyrrolidones).

Imageable Elements

The imageable elements can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition. If the substrate has been treated to provide an "interlayer" for improved adhesion or hydrophilicity, the applied imageable layer is disposed thereon but these interlayers are not considered "imageable layers".

The element optionally includes what is conventionally known as an overcoat (also known as an "oxygen impermeable topcoat" or "oxygen barrier layer") disposed over the imageable layer. Such overcoat layers can comprise one or more poly(vinyl alcohol)s as the predominant polymeric binders, each of which has a hydrolysis level of up to 99%, typically from about 60 and up to and including 90% and more typically from about 75 and up to and including 85%. By "hydrolysis level", we are referring to the specific percentage of acetate moieties in the polymer having been converted to hydroxyl groups. Thus, vinyl acetate is polymerized to form poly(vinyl acetate) and a hydroxide (usually sodium or potassium hydroxide) is used to convert acetate groups to hydroxyl groups.

While the poly(vinyl alcohol)s described above can comprise up to 100% of the total overcoat dry weight, usually, they comprise at least 60 and up to 95% of the total overcoat dry weight. The overcoat thus can include up to 40 weight % of other components including but not limited to, other polymeric binders such as poly(vinyl pyrrolidone), poly(ethyleneimine), poly(vinyl imidazole), copolymers from two or more of vinyl pyrrolidone, ethyleneimine and vinyl imidazole, and mixtures of such polymers, and well as cationic, anionic, and non-ionic wetting agents or surfactants, flow improvers or thickeners, antifoamants, colorants, particles such as aluminum oxide and silicon dioxide, and biocides. Details about such addenda are provided in WO 99/06890 (Pappas et al.).

The dry overcoat coating weight is generally at least 0.1 and up to and including 4 g/m² and typically from about 0.5 to about 2 g/m².

The overcoat can be disposed over the imageable layer by applying a coating formulation containing the desired poly (vinyl alcohol) and any other components in a suitable solvent or mixture of solvents (such as isopropyl alcohol, water, or both) to the dried imageable layer, and suitable drying procedures.

Other topcoat layer polymer binders are also described in U.S. Pat. No. 3,458,311 (Alles), U.S. Pat. No. 4,072,527 (Fanni), and U.S. Pat. No. 4,072,528 (Bratt), and EP Publications 275,147A2 (Wade et al.), 403,096A2 (Ali), 354,475A2 (Zertani et al.), 465,034A2 (Ueda et al.), 352, 630A2 (Zertani et al.), U.S. Pat. No. 1,788,429 (Loccufier et al.), U.S. Pat. No. 1,788,431 (Van Damme et al.) and U.S. Pat. No. 1,788,434 (Van Damme et al.) and US Patent Application Publication 2005/0266349 (Van Damme et al.).

In most embodiments, the imageable layer is the outermost layer of the lithographic printing plate precursor.

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 g/m² and more typically from about 3 to about 4.3 g/m². Phosphoric acid anodization generally provides an oxide weight on the surface of from about 1.5 to about 5 g/m² and more typically from about 1 to about 3 g/m². When sulfuric acid is used for anodization, higher oxide weight (at least 3 g/m²) may provide longer press life.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

A radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, primary polymeric binder, initiator composition, radiation absorbing compound, and any other components of the radiation-sensitive composition in a suitable coating solvent including water, organic solvents [such as glycol ethers including 1-methoxypropan-2-ol, methyl ethyl ketone(2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 $g/m^2$ or at least 0.5 and up to and including 3.5 $g/m^2$. Any particulate primary polymeric binders present in the imageable layer may partially coalesce or be deformed during the drying operation.

Layers can also be present under the imageable layer to enhance developability or to act as a thermal insulating layer. The underlying layer should be soluble or at least dispersible in the developer and typically have a relatively low thermal conductivity coefficient.

Imaging Conditions

During use, the imageable element is exposed to a suitable source of exposing radiation depending upon the radiation absorbing compound present in the radiation-sensitive composition to provide specific sensitivity, that is at a wavelength of from about 150 to about 475 nm or from about 700 to about 1400 nm. For example, imaging can be carried out using imaging or exposing radiation, such as from an infrared laser (or array of lasers) at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.).

Imaging with infrared radiation can be carried out generally at imaging energies of at least 30 $mJ/cm^2$ and up to and including 500 $mJ/cm^2$, and typically at least 50 and up to and including 300 $mJ/cm^2$ depending upon the sensitivity of the imageable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 $mJ/cm^2$ and up to and including 0.5 $mJ/cm^2$, and typically at least 0.02 and up to and including about 0.1 $mJ/cm^2$. It would be desirable, for example, to image the UV/visible radiation-sensitive imageable elements at a power density in the range of at least 0.5 and up to and including 50 $kW/cm^2$ and typically of at least 5 and up to and including 30 $kW/cm^2$, depending upon the source of energy (violet laser or excimer sources)

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

After imaging of negative-working imageable elements, a heating step might be used to accelerate the formation of a latent image. This heating step can be realized in so called "preheat units" that can be a separate machine or integrated into the processor that develops the imaged element. There are different types of preheat units. The most common ones use infrared radiation or hot air circulation, or combination thereof, to heat the imaged element. The temperature used for the purpose is from about 70 to about 200° C. and typically from about 90 to about 160° C.

Before developing the imaged element, a pre-rinse step might be carried out especially for the negative-working elements having a protective oxygen barrier or topcoat. This pre-rinse step can be carried out in a stand-alone apparatus or by manually rinsing the imaged element with water or the pre-rinse step can be carried out in a washing unit that is integrated in a processor used for developing the imaged element. For the free radical generating radiation-sensitive compositions and imageable elements, both the preheat unit and the pre-rinse unit are usually integrated into the processor used for developing the imaged element.

Development and Printing

After imaging, the imaged elements can be processed "off-press" using a suitable processing solution described herein. Such processing is carried out for a time sufficient to remove predominantly only the non-exposed regions of the imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible". In some embodiments, development (step C) is carried out after application of the coloring fluid (step B).

Development can be accomplished using what is known as "manual" development, "dip" development, or processing with an automatic development apparatus (processor). In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged element is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers or processing solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally greater than 7 and up to 14. The imaged elements are generally developed using conventional processing conditions. Both aqueous alkaline developers and organic solvent-containing developers can be used.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates), and can be diluted with water prior to use if desired.

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and preferably, they are alkaline in pH.

Representative solvent-based developers include ND-1 Developer, Developer 980, Developer 1080, 2 in 1 Developer, 955 Developer, D29 Developer (described below), and 956 Developer (all available from Eastman Kodak Company). These developers can be diluted with water if desired.

In some instances, a single processing solution is used to both develop the imaged element by removing predominantly the non-exposed regions and also to provide a protective layer or coating over the entire imaged and developed outer surface. In this aspect, the processing solution can behave somewhat like a gum that is capable of protecting the lithographic image on the printing plate against contamination or damage (for example, from oxidation, fingerprints, dust, or scratches). Such processing solutions are described for example in copending and commonly assigned U.S. Ser. No. 12/104,544 (filed Apr. 17, 2008 by K. Ray, Yu, and Saraiya) that is incorporated herein by reference. Such processing solutions generally have a pH greater than 2 and up to about 11, and typically from about 6 to about 11, or from about 6 to about 10.5, as adjusted using a suitable amount of an acid or base. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include salts of fatty acids, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

The one or more anionic surfactants can be generally present in an amount of at least 1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

The processing solution (or developer) can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). As noted above, the imaged element can be immersed in the processing solution and rubbed by hand or with an apparatus.

The processing solution can also be applied in a processing unit (or station) in a suitable apparatus that has at least one roller for rubbing or brushing the imaged element while the processing solution is applied. By using such a processing unit, the non-exposed regions of the imaged layer may be removed from the substrate more completely and quickly. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

In some embodiments, the coloring fluid described above is also used for development so that steps B and C are carried out simultaneously. In other words, the coloring fluid is also the processing solution. This development step can also include mechanical or manual rubbing or brushing of the imaged printing plate precursor in order to facilitate removal of the non-exposed regions of the imageable layer in the presence of the coloring fluid. The coloring fluid can be rinsed off with water or removed by the action of a rubber roller or squeegee without rinsing. The coloring fluid can also include a gum (as described above) that protects the printing plate against scratches and oxidation until it is mounted onto a printing press.

Following off-press development, the resulting lithographic printing plate can be postbaked with or without blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements used in this invention are "on-press" developable particularly when the elements contain a polymeric binder in the imageable layer in the form of discrete particles. The imaged element is directly mounted onto a printing press after step B wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.). Such on-press development would be carried out after the coloring fluid is applied as described above.

The present invention provides at least the following embodiments:

Embodiment 1

A method of preparing a lithographic printing plate comprising:

A) imagewise exposing a negative-working lithographic printing plate precursor comprising a substrate and a radiation-sensitive imageable layer disposed thereon comprising a free radically polymerizable compound, a radiation absorbing compound, a free radical initiator composition, and a polymeric binder to provide an exposed precursor having solid exposed regions and non-exposed regions in the imageable layer wherein the solid exposed regions have an optical density of $OD_1$, B) applying a coloring fluid to the exposed precursor such that the optical density in the solid exposed regions is $OD_2$ that is greater than $OD_1$, the coloring fluid comprising a water-insoluble colorant and a solvent that is capable of swelling the solid exposed regions of the imageable layer.

Embodiment 2

The method of embodiment 1 wherein the non-exposed regions of the imageable layer are at least partially retained after step B.

Embodiment 3

The method of embodiment 1 or 2 wherein after step B, the exposed precursor is developed on-press using a lithographic printing ink, fountain solution, or both.

Embodiment 4

The method of embodiment 1 further comprising:

C) prior to, simultaneously with, or subsequently to step B, developing the exposed precursor off-press using a processing solution to remove the non-exposed regions of the imageable layer and to provide a lithographic printing plate.

Embodiment 5

The method of embodiment 4 further comprising, after developing the exposed precursor, rinsing it with water.

Embodiment 6

The method of embodiment 4 or 5 wherein the non-exposed regions are removed after step B.

Embodiment 7

The method of any of embodiments 4 to 6 wherein step C is carried out prior to step B.

Embodiment 8

The method of any of embodiments 4 to 7 wherein the processing solution both develops and protects the outer surface of the lithographic printing plate.

Embodiment 9

The method of any of embodiments 1 to 8 wherein the water-insoluble colorant is a pigment or water-insoluble dye.

Embodiment 10

The method of any of embodiments 1 to 9 wherein the solvent capable of swelling the exposed imageable layer is benzyl alcohol, phenoxy ethanol, γ-butyrolactone, butoxyethanol, diacetone alcohol, cyclohexanone, cyclohexanol, a glycol ether, a glycol ester, an alkyl lactate, toluene, a petroleum fraction, or a combination of any of these.

Embodiment 11

The method of any of embodiments 1 to 10 wherein the coloring fluid further includes a surfactant, a wetting agent or dispersing agent, an aluminum de-sensitizer, or any combination thereof.

Embodiment 12

The method of any of embodiments 1 to 11 wherein the coloring fluid further comprises one or more of a glycol, gum, dextrine, cellulose ether or ester, phosphoric acid or ester, phosphonic acid or ester, citric acid, or citrate.

Embodiment 13

The method of any of embodiments 1 to 12 wherein the coloring fluid comprises a nonionic surfactant.

Embodiment 14

The method of any of embodiments 1 to 13 wherein the water-insoluble colorant is present in the coloring fluid in an amount of at least 0.5% by weight.

Embodiment 15

The method of any of embodiments 1 to 14 wherein the difference between $OD_1$ and $OD_2$ is more than 0.1.

Embodiment 16

The method of any of embodiments 1 to 15 wherein the difference between $OD_1$ and $OD_2$ is more than 0.25.

Embodiment 17

The method of any of embodiments 1 to 16 wherein step B further comprises mechanically or manually brushing or rubbing the exposed precursor in the presence of the coloring fluid.

Embodiment 18

The method of any of embodiments 1 to 17 wherein the polymeric binder in the imageable layer is present as a film-forming continuous polymer or as discrete particles.

Embodiment 19

The method of any of embodiments 1 to 3 wherein the lithographic printing plate precursor is on-press developable.

Embodiment 20

The method of any of embodiments 1 to 19 wherein the radiation-sensitive imageable layer is the outermost layer of the negative-working lithographic printing plate precursor.

Embodiment 21

The method of any of embodiments 1 to 20 wherein the radiation-sensitive imageable layer is sensitive to imaging at a wavelength of from about 150 nm to about 475 nm or from about 750 nm to about 1400 nm.

The following examples are provided to illustrate the present invention but not to limit it in any manner.

Comparative Example 1

An electrochemically-grained and phosphoric acid anodized aluminum substrate that had been post-treated with poly (acrylic acid) was coated with the imageable layer formulation. The resulting printing plate precursor was imaged a solid at 320 mJ/cm² on a Kodak® Trendsetter 3244x plate setter.

The general imageable layer formulation was that described in Example 18 of U.S. Pat. No. 7,261,998 (Hayashi et al.) that is incorporated herein by reference.

The imaged printing plate precursor was manually developed with light pressure hand scrubbing in a developer containing 9% γ-butyrolactone in water in 6 seconds. The image optical density (OD) was measured using a spectrodensitometer model 500 fitted with a cyan filter. The resulting image had an optical density of 0.39 before developing and 0.36 after developing. The difference between the optical density of the imaged regions (0.36) and that of the background (0.21) was 0.15, indicating very little contrast between the image and the background. This made the printing plate image areas very difficult to examine before it was mounted onto a printing press.

Comparative Example 2

Aqueous pigment dispersions from Ciba (IJX 1409, 883 and 1281) were rubbed into the printing plate precursor described in Comparative Example 1 that had been imaged a solid at 320 mJ/cm². The printing plate precursor was then rinsed in water. The above pigment dispersions did not develop the imaged precursors but they provided a modest optical density increase from $OD_1$=0.39 to $OD_2$=0.46 to the solid image regions as measured with a spectrodensitometer model 500 fitted with a cyan filter.

Comparative Example 3

A printing plate precursor as described in Comparative Example 1 was imaged at 320 mJ/cm², forming an image of low optical density $OD_1$=0.39 on the solid area. The imaged precursor was rubbed with light pressure with an aqueous dispersion Micropigmo WMBK-5 from Orient Corp. of America containing 20% carbon black for 1 minute. The resulting printing plate was rinsed in water. This pigment dispersion did not develop the imaged precursor. The $OD_2$ of the solid area became 0.44, which was insufficient for the image features to be read with a spectrodensitometer as part of plate pre-press evaluation. The image optical density was measured with a spectrodensitometer model 500 fitted with a cyan filter.

Comparative Example 4

A printing plate precursor described in Comparative Example 1 was imaged in a solid strip at 320 mJ/cm² and formed an image of low optical density $OD_1=0.39$. The printing plate was cut into pieces that were rubbed for 1 minute with aqueous solutions of water soluble dyes of different classes: (i) sulfonephthaleine: Bromocresol Purple (5,5'-dibromo-o-cresolsulfonephthalein, Na salt), 8% and Bromothymol Blue (3,3'-dibromothymolsulfonephthalein, sodium salt), 6%; (ii) triphenyl methane dyes such as Brilliant Blue R (Acid Blue 83), 5%; (iii) cationic thiazine class: Methylene Blue (3,7-bis(dimethylamino)phenothiazin-5-ium chloride), 5% and (iv) anionic monoazo class: Acid Alizarin Violet N (Mordant Violet 5), 6% and Hydroxynaphthol Blue disodium salt, 9%. The solutions did not develop the plate. There was very little OD increase (from $OD_1=0.39$ to maximum $OD_2=0.42$) as the dyes were lost in water during the rinsing step. The image optical density was measured with a spectrodensitometer model 500 fitted with a cyan filter for the blue shades and with a magenta filter for the red and purple shades.

Comparative Example 5

This example used Water Black 510 (Acid Black 2), a nigrosine dye turned water soluble by sulfonation from Orient Corp. of America. A color enhancement solution was prepared containing 20% Water Black 510, 9% BLO, and 71% water. A printing plate precursor was prepared as in Comparative Example 1 and imaged with a solid with an IR laser at 320 mJ/cm². The imaged element was rubbed in the color enhancement solution for 60 seconds and rinsed in water. The imaged element was developed in this colored developer but the optical density of the solid image remained 0.39 before and after the treatment. The water soluble dye did not permeate the coating and was washed off in the rinsing water. The image optical density was measured with a spectrodensitometer model 500 fitted with a cyan filter.

Invention Example 1

This is an example of developing and coloring in one step. A sample of the printing plate precursor described in Comparative Example 1 was imaged with a solid image using an IR diode laser at an energy of 320 mJ/cm². The imaged precursor was then manually developed with light hand scrubbing in a developer-coloring fluid containing 10% CI Pigment Red 17, 0.5% Disperbyk® 191 (Byk Chemie) and 9% γ-butyrolactone (BLO) in water. The background was removed in 6 seconds and the optical density of the solid image showed an optical density increase from $OD_1=0.39$ before treatment to $OD_2=0.54$ after treatment. By increasing the rubbing time to 60 seconds, the $OD_2$ of the solid image areas was increased to 0.95. The printing plate was rinsed in water and the dot area of 1%-99% screens was read with a spectrodensitometer model 500 fitted with a magenta filter, giving correct values within a precision of ±1%. The printing plate was mounted on an AB Dick press and used to print up to 200 sheets, showing a clean printing from the first sheet and complete ink receptivity of the image areas after 5 sheets. The lithographic printing ink used in printing was VS506 Pantone reflex Blue that was obtained from Royal Dutch Printing Ink Factories, Holland and the fountain solution was made with Supreme Fount 6038 and PAR concentrate, 1:1, 4 oz/gal each from Day, International Inc., USA. The same ink and fountain solution were used in the following examples unless otherwise specified.

Invention Example 2

A sample of the printing plate precursor described in Comparative Example 1 was imaged using an IR diode laser at an energy of 320 mJ/cm² and then manually developed with moderate hand scrubbing in a commercial pigmented developer-coloring fluid, Envirotech Red Developer that was obtained from Western Litho (Mitsubishi) containing red pigment, phosphoric acid, benzyl alcohol, and BLO among other ingredients. The background was removed within 6 seconds and the image was colored. The printing plate was then rinsed with water. The optical density of the solid image increased from $OD_1=0.39$ to $OD_2=0.65$ after 6 seconds of rubbing. By increasing the rubbing time to 60 seconds, the optical density was increased to $OD_2=1.00$. The resulting printing plate was rinsed with water and the dot area of 1%-99% screens was read using a spectrodensitometer model 500 with a magenta filter giving correct values with a precision of ±1%. The printing plate was used to print 200 sheets on an AB Dick press showing ink receptivity within 5 sheets and clean background from the first sheet.

This positive result is in contrast to the results in Comparative Example 6 where the developing-coloring fluid led to excessive coating softening and smudging on the plate that resulted in toning.

Invention Example 3

A sample of the printing plate precursor described in Comparative Example 1 was imaged using an IR diode laser at an energy of 320 mJ/cm² and then manually developed with moderate hand scrubbing in commercial pigmented developer, Black Diamond Developer from Western Litho containing black pigment, ethylene glycol, phosphoric acid, di-propyleneglycol methyl ether, propylene glycol methyl ether acetate (PGMEA), and BLO among other ingredients, in unknown proportions. The background was removed within 6 seconds and the image was colored in black, with the optical density of the solid imaged area increasing from $OD_1=0.39$ to $OD_2=0.65$. By increasing the rubbing time to 60 seconds, the optical density increased to 0.95. The printing plate was rinsed in water and the dot area of 1%-99% screens was read with a spectrodensitometer model 500 fitted with a cyan filter, giving correct values with a precision of ±1%. The printing plate was used to print 200 sheets on an AB Dick press showing ink receptivity within 5 sheets and clean background from the first sheet.

Invention Example 4

This example shows that softening the top layer of the image with a suitable solvent creates the conditions for the coloring of the plate with an aqueous pigment that otherwise brings little color when rubbed on the plate as in Comparative Example 2.

A sample of the printing plate precursor described in Comparative Example 1 was imaged at 320 mJ/cm² and developed using 20% 955 Developer that contains 1% benzyl alcohol. The resulting printing plates were patted dry with no rinsing to preserve the softened top layer of the image. The printing plate was then lightly rubbed with IJX 883 dispersion from Ciba as a coloring fluid for 30 seconds. The optical density of the solid image regions was measured using a spectrodensitometer model 500 fitted with a cyan filter. The optical density increased from $OD_1=0.36$ before coloring to $OD_2=0.56$ after coloring.

Invention Example 5

This example represents an improvement from Comparative Example 2. A developer-coloring fluid was prepared by adding 1% benzyl alcohol to the aqueous pigment dispersion IJX 883 from Ciba. A sample of the printing plate precursor as described in Comparative Example 1 was imaged at 320 mJ/cm$^2$ and then developed and colored in one step within 6 seconds. The optical density was measured with a spectrodensitometer model 500 fitted with a cyan filter and was increased from $OD_1$=0.39 to $OD_2$=0.59.

Invention Example 6

This example shows that there is an optimum concentration of the solvent in the coloring fluid. Three pigmented developers-coloring fluids were prepared by adding BLO in concentrations 1%, 9% and 14% to the Ciba dispersion IJX 883. A sample of the printing plate precursor as described in Comparative Example 1 was imaged at 320 mJ/cm$^2$ and then developed using the above colored developers within 16 seconds. Using the developer at 1% BLO concentration, the optical density of the solid image area increased from $OD_1$=0.39 to $OD_2$=0.47 and the plate was not completely developed. Using the developer at 9% BLO and 16 seconds developing time, the imaged precursor was well developed with a clean background and the $OD_2$ of the colored image was 0.51. Increasing the concentration of BLO in the developer to 14% resulted in a lower $OD_2$ of 0.40 because part of the upper pigmented layer of the image was washed away, coloring the rinsing water. This was due to excessive softening of the coating by too high a concentration of the BLO solvent.

When the imaged precursor was developed in the pigmented developer containing 9% BLO within 26 seconds, the optical density of the plate was increased from $OD_1$=0.39 to $OD_2$=0.60, as compared to an increase of from $OD_1$=0.39 to $OD_2$=0.51 when the imaged precursor was developed within 16 seconds. The optical density of the solid imaged regions was measured using a spectrodensitometer model 500 fitted with a cyan filter.

Invention Example 7

A pigment concentrate was prepared from 20% Irgalite® GLVO phthalocyanine pigment (Ciba), 2% Solsperse® 20000 polymeric dispersant and 78% methoxypropanol. A pigmented developer-coloring fluid was prepared using the pigment concentrate. The pigmented developer contained: 4% benzyl alcohol, 5% Irgalite® GLVO, 0.5% Solsperse® 20000 polymeric dispersant, 19.5% methoxypropanol, and the balance to 100%, water. A sample of the printing plate precursor as described in Comparative Example 1 was imaged at 320 mJ/cm$^2$ and then developed and colored in this pigmented developer in 20 seconds, imparting an optical density increase to the solid imaged area of the plate of from $OD_1$=0.39 to $OD_2$=0.50. The optical density of the solid imaged regions was measured using a spectrodensitometer model 500 fitted with a cyan filter.

Invention Example 8

This example used an oil soluble dye that can diffuse in the hydrophobic coating as opposed to Comparative Examples 4 and 5 that used water soluble dyes unable to diffuse in the hydrophobic coating and that ended up being washed away in the rinsing water.

A coloring fluid was prepared containing 20% Oil Black 860 (Solvent Black 3), a nigrosine dye obtained from Orient Corp. of America in toluene. A sample of the printing plate precursor as described in Comparative Example 1 was imaged at 320 mJ/cm$^2$ and developed using 955 Developer diluted 1:4 in water and containing 1% benzyl alcohol after dilution. The plate was rinsed in water and dried. The plate was then wetted with fountain solution to protect the anodized aluminum background and then rubbed with the coloring fluid for 30 seconds, rinsed in water and dried. The plate had a clean background and an optical density increase of from $OD_1$=0.36 to $OD_2$=1.50. The optical density of the solid imaged regions was measured using a spectrodensitometer model 500 fitted with a cyan filter.

Invention Example 9

This is an example of coloring the plate before developing in a suitable developer. 20% Oil Black 860 was pre-dissolved in 80% in benzyl alcohol and used as a color concentrate to prepare the coloring fluid containing Oil Black 860 (2%), benzyl alcohol (8%), Dysperbyk® 191 (0.26%), Lugalvan® BNO 24 (BASF) (1%), and water the balance to 100%. A printing plate precursor was prepared as described in Comparative Example 1 and imaged at 320 mJ/cm$^2$. The resulting plate was rubbed for 60 seconds with the coloring fluid that colored the imaged precursor but did not develop it. The precursor was immediately developed in 955 Developer for 12 seconds, then rinsed in water and dried. The optical density of the solid imaged regions was measured using a spectrodensitometer model 500 fitted with a cyan filter.

The printing plate showed an optical density increase of the solid image of from $OD_1$=0.39 to $OD_2$=0.65. The background was clean and the $D_{min}$ (the difference between the optical density of the treated and developed background and the untreated developed background) was 0.002. The printing plate was mounted on an AB Dick press and used to print 200 impressions. The print-out was clean from the first sheet and the 2-98% highlights read their corresponding values within ±1% of their value.

Invention Example 10

A coloring fluid concentrate was made from 20% Oil Black 860 and 80% in benzyl alcohol and used to prepare the working strength coloring fluid containing Oil Black 860 (2%), benzyl alcohol (8%), Dysperbyk® 191 (0.26%), and Lugalvan® BNO 24 (1%) and water, the balance to 100%. A printing plate precursor was prepared as described in Comparative Example 1 and imaged at 320 mJ/cm$^2$. Strips of this precursor were rubbed for 15 seconds, 30 seconds, and 60 seconds with the coloring fluid in a Sutherland rub tester with a 500 g weight attached to the rubbing arm. After the amount of time elapsed, the imaged elements were immediately developed in 955 Developer, rinsed in water and dried. The image was colored in blue and the optical density of the solid area of the image increased from $OD_1$=0.39 before coloring to $OD_2$=0.65 after coloring regardless of the rubbing time. The optical density of the solid imaged regions was measured using a spectrodensitometer model 500 fitted with a cyan filter.

Invention Example 11

A coloring fluid concentrate made from 20% Oil Black 860 and 80% phenoxyethanol and used to prepare a coloring fluid containing Oil Black 860 (2%), phenoxyethanol (8%), Dysperbyk® 191 (0.26%), Lugalvan® BNO 12 (1%), and water as the balance to 100%. A printing plate precursor was prepared as described in Comparative Example 1 and imaged with 320 mJ/cm$^2$. The coloring fluid was rubbed on it for 15 seconds and then immediately developed in 955 Developer. The printing plate was rinsed and dried. The optical density of the solid imaged regions was measured using a spectrodensitometer model 500 fitted with a cyan filter.

The optical density of the solid regions of the image increased from $OD_1=0.39$ of the uncolored plate to $OD_2=0.75$ for the colored plate making it perfectly readable before it was mounted on an AB Dick press where it was used to print up to 200 impressions with good rendition of the 2%-98% screens within ±1% of their nominal value.

Invention Example 12

A coloring fluid concentrate made from 20% Oil Black 860 and 80% methyl cellosolve. The concentrate was used to prepare a working strength coloring fluid containing Oil Black 860 (2%), methyl cellosolve (8%), Dysperbyk® 163 (0.26%), Lugalvan® BNO 12 (2%) and the balance water to 100%. A printing plate precursor was prepared as described in Comparative Example 1 and imaged at 320 mJ/cm². The coloring fluid was rubbed in the imaged plate for 30 seconds and then immediately developed in 955 Developer. The printing plate was rinsed and dried. The optical density of the solid areas of the image increased from $OD_1=0.39$ of the uncolored plate to $OD_2=0.75$ for the colored plate. The optical density of the solid imaged regions was measured using a spectrodensitometer model 500 fitted with a cyan filter.

Invention Example 13

A coloring fluid concentrate was made from 20% Oil Black 860 and 80% phenoxyethanol and used to prepare a coloring fluid containing: Oil Black 860 (2%), phenoxyethanol (8%), Dysperbyk® 191 (0.26%), Lugalvan® BNO 24 (1%), and water (88.74%). Printing plate precursors were prepared as described in Comparative Example 1 and imaged 320 mJ/cm². The coloring fluid was rubbed in it for 15 seconds or 30 seconds and then developed in 955 Developer, rinsed in water and dried. The optical density of the solid imaged regions was measured using a spectrodensitometer model 500 fitted with a cyan filter.

The plates had an optical density increase from $OD_1=0.30$ to $OD_2=0.75$ on the solid area of the image regardless of the rubbing time. The colored plates and an uncolored reference plate prepared as in Comparative Example 1 were mounted on a Miehle press and printed with accelerated wear black ink #9 containing 1.5% calcium carbonate from Gans Ink and Supply Co. The colored plates had the same run length as the uncolored reference, 25,000 impressions, before the solid showed a slight wear. Measurements of dot area on the 2-50% screens showed that throughout the printing up to 25,000 impressions the dot area remained constant and there was no dot sharpening or dot increase for the printing plates that were rubbed with the coloring fluid as well as for the un-colored reference.

Invention Example 14

This is an example of using a coloring fluid after developing. A printing plate precursor was prepared as described in Comparative Example 1 and imaged with 320 mj/cm². The imaged element was developed in 955 Developer that was diluted 1:4 with water. The printing plate was then rinsed in water and dried. A coloring fluid was prepared by dispersing 10% CI Pigment Red 17 in a 90% aqueous solution containing 0.5% Disperbyk® 191 and 1% benzyl alcohol. The plate was wetted with a fountain solution to protect the anodized aluminum background and then rubbed with the coloring fluid for 30 seconds, rinsed in water and dried. The optical density of the solid areas of the image increased from $OD_1=0.39$ before coloring to $OD_2=0.60$ after color treatment. The optical density of the solid imaged regions was measured using a spectrodensitometer model 500 fitted with a magenta filter.

Invention Example 15

A commercially available printing plate precursor, Eco Max$^T$/Pro T (Fujifilm) was imaged at 160 mJ/cm² using a Kodak® Trendsetter platesetter. A concentrate was made containing 20% Oil Black 860 and 80% phenoxy ethanol. A coloring fluid was made from this concentrate containing 2% Oil Black 860, 8% phenoxyethanol, 0.26% Dysperbyk® 191, 6% Lugalvan® 24 surfactant, and water to 100%. The imaged printing plate precursor was rubbed lightly with a cloth dipped in the coloring fluid for 45 seconds and then developed right away by wiping the precursor twice with a cloth dipped in 955 Developer to remove most of the black dye and the non-imaged coating. The lithographic printing plate was then rinsed with water and dried. The optical density of the imaged printing plate $OD_1$ was 0.63. The $OD_2$ of the colored solid image was 1.20. The percentage dot area of the 0.5%-99% highlights was read using a spectrodensitometer model 500 fitted with a cyan filter giving correct values within 1%.

A reference lithographic printing plate was prepared by developing a sample of the Eco Max$^T$ precursor that had been imaged as described above, in 955 Developer. The colored printing plate and the reference printing plate were each mounted on an AB Dick press and used to print 200 sheets. Both the reference printing plate and the colored printing plate came to full ink density within 10 printed sheets and showed all printed features throughout the test up to 200 printed sheets.

The invention has been described in detail with particular reference to certain preferred embodiments thereof, but it will be understood that variations and modifications can be effected within the spirit and scope of the invention.

The invention claimed is:
1. A method of preparing a lithographic printing plate comprising:
A) imagewise exposing a negative-working lithographic printing plate precursor comprising a substrate and a radiation-sensitive imageable layer disposed thereon comprising a free radically polymerizable compound, a radiation absorbing compound, a free radical initiator composition, and a polymeric binder to provide an exposed precursor having solid exposed regions and non-exposed regions in said imageable layer wherein said solid exposed regions have an optical density of $OD_1$,
wherein said radiation-sensitive imageable layer is the outermost layer of said negative-working lithographic printing plate precursor,
B) applying a coloring fluid to said exposed precursor such that the optical density in said solid exposed regions is $OD_2$ that is greater than $OD_1$,
said coloring fluid comprising a water-insoluble colorant and a solvent that is capable of swelling said solid exposed regions of said imageable layer.
2. The method of claim 1 wherein said non-exposed regions of said imageable layer are at least partially retained after step B.

3. The method of claim 1 wherein after step B, said exposed precursor is developed on-press using a lithographic printing ink, fountain solution, or both.

4. The method of claim 1 further comprising:
C) prior to, simultaneously with, or subsequently to step B, developing said exposed precursor off-press using a processing solution to remove said non-exposed regions of said imageable layer and to provide a lithographic printing plate.

5. The method of claim 4 further comprising, after developing said exposed precursor, rinsing it with water.

6. The method of claim 4 wherein said non-exposed regions are removed after step B.

7. The method of claim 4 wherein step C is carried out prior to step B.

8. The method of claim 4 wherein said processing solution both develops and protects the outer surface of said lithographic printing plate.

9. The method of claim 1 wherein said water-insoluble colorant is a pigment or water-insoluble dye.

10. The method of claim 1 wherein said solvent capable of swelling said exposed imageable layer is benzyl alcohol, phenoxy ethanol, γ-butyrolactone, butoxyethanol, diacetone alcohol, cyclohexanone, cyclohexanol, a glycol ether, a glycol ester, an alkyl lactate, toluene, a petroleum fraction, or a combination of any of these.

11. The method of claim 1 wherein said coloring fluid further includes a surfactant, a wetting agent or dispersing agent, an aluminum de-sensitizer, or any combination thereof.

12. The method of claim 1 wherein said coloring fluid further comprises one or more of a glycol, gum, dextrine, cellulose ether or ester, phosphoric acid or ester, phosphonic acid or ester, citric acid, or citrate.

13. The method of claim 1 wherein said coloring fluid comprises a nonionic surfactant.

14. The method of claim 1 wherein said water-insoluble colorant is present in said coloring fluid in an amount of at least 0.5% by weight.

15. The method of claim 1 wherein the difference between $OD_1$ and $OD_2$ is more than 0.1.

16. The method of claim 1 wherein the difference between $OD_1$ and $OD_2$ is more than 0.25.

17. The method of claim 1 wherein said step B further comprises mechanically or manually brushing or rubbing said exposed precursor in the presence of said coloring fluid.

18. The method of claim 1 wherein said polymeric binder in said imageable layer is present as a film-forming continuous polymer or as discrete particles.

19. The method of claim 1 wherein said lithographic printing plate precursor is on-press developable.

20. The method of claim 1 wherein said radiation-sensitive imageable layer is sensitive to imaging at a wavelength of from about 150 nm to about 475 nm or from about 750 nm to about 1400 nm.

* * * * *